(12) United States Patent
Lee

(10) Patent No.: US 11,088,091 B2
(45) Date of Patent: Aug. 10, 2021

(54) SEMICONDUCTOR PACKAGE

(71) Applicant: Samsung Electronics Co., Ltd., Suwon-si (KR)

(72) Inventor: Su Chang Lee, Seoul (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 16/866,988

(22) Filed: May 5, 2020

(65) Prior Publication Data

US 2020/0266156 A1 Aug. 20, 2020

Related U.S. Application Data

(63) Continuation of application No. 16/115,851, filed on Aug. 29, 2018, now Pat. No. 10,651,133.

(30) Foreign Application Priority Data

Jan. 29, 2018 (KR) .................. 10-2018-0010700

(51) Int. Cl.
*H01L 23/31* (2006.01)
*H01L 25/065* (2006.01)
(Continued)

(52) U.S. Cl.
CPC ............ *H01L 23/562* (2013.01); *H01L 23/16* (2013.01); *H01L 23/3128* (2013.01);
(Continued)

(58) Field of Classification Search
CPC .............. H01L 23/3142; H01L 23/562; H01L 23/3128; H01L 23/3135; H01L 25/0655; H01L 23/367; H01L 25/18; H01L 23/49816; H01L 23/295; H01L 24/16; H01L 24/32; H01L 24/73; H01L 23/3157;
(Continued)

(56) References Cited

U.S. PATENT DOCUMENTS 7,804,170 B2 9/2010 Kakegawa
8,791,562 B2 7/2014 Lee et al.
(Continued)

FOREIGN PATENT DOCUMENTS

JP 2010-515242 A 5/2010
WO WO 2008/026077 A2 3/2008

*Primary Examiner* — Thanh Y. Tran
(74) *Attorney, Agent, or Firm* — Muir Patent Law, PLLC

(57) ABSTRACT

A semiconductor package includes a substrate having first and second surfaces, first and second pads disposed on the first and second surfaces respectively and electrically connected to each other, a semiconductor chip disposed on the first surface and connected to the first pads, a dummy chip disposed on the first surface, the dummy chip having an upper surface positioned lower than an upper surface of the semiconductor chip in a direction perpendicular to the first surface of the substrate, an underfill between the semiconductor chip and the first surface of the substrate with an extension portion extended along facing side surfaces of the semiconductor chip and the dummy chip in the perpendicular direction, an upper end of the extension portion lower than the upper surface of the semiconductor chip, and a sealing material on the first surface to seal the semiconductor chip and the dummy chip.

20 Claims, 14 Drawing Sheets

(51) Int. Cl.
*H01L 23/00* (2006.01)
*H01L 23/367* (2006.01)
*H01L 23/538* (2006.01)
*H01L 25/18* (2006.01)
*H01L 23/498* (2006.01)
*H01L 23/16* (2006.01)
*H01L 23/29* (2006.01)

(52) U.S. Cl.
CPC ...... *H01L 23/3135* (2013.01); *H01L 23/3142* (2013.01); *H01L 23/367* (2013.01); *H01L 23/3675* (2013.01); *H01L 23/49816* (2013.01); *H01L 23/5385* (2013.01); *H01L 23/5386* (2013.01); *H01L 25/0655* (2013.01); *H01L 25/18* (2013.01); *H01L 23/295* (2013.01); *H01L 24/16* (2013.01); *H01L 24/32* (2013.01); *H01L 24/73* (2013.01); *H01L 2224/16227* (2013.01); *H01L 2224/32225* (2013.01); *H01L 2224/73204* (2013.01); *H01L 2924/1431* (2013.01); *H01L 2924/1434* (2013.01); *H01L 2924/3511* (2013.01)

(58) Field of Classification Search
CPC ............... H01L 23/315; H01L 23/3185; H01L 23/3192; H01L 25/0753; H01L 2924/1431; H01L 25/071; H01L 25/0652
See application file for complete search history.

(56) References Cited

U.S. PATENT DOCUMENTS

| | | |
|---|---|---|
| 8,952,533 B2 | 2/2015 | Mohammed et al. |
| 9,613,931 B2 | 4/2017 | Lin et al. |
| 9,659,896 B2 | 5/2017 | Chang et al. |
| 10,651,133 B2 * | 5/2020 | Lee .................. H01L 23/562 |
| 2009/0267212 A1 | 10/2009 | Wada et al. |
| 2012/0193779 A1 * | 8/2012 | Lee .................. H01L 21/563 257/737 |
| 2017/0032980 A1 | 2/2017 | Hwang et al. |
| 2017/0373037 A1 | 12/2017 | Yu et al. |
| 2018/0138101 A1 * | 5/2018 | Yu ..................... H01L 23/147 |
| 2018/0138116 A1 * | 5/2018 | Lin .................... H01L 24/06 |
| 2019/0006341 A1 * | 1/2019 | Lin .................... H01L 21/4857 |
| 2019/0096825 A1 | 3/2019 | Kim et al. |

* cited by examiner

SEMICONDUCTOR PACKAGE

CROSS-REFERENCE TO RELATED APPLICATION

This application is a continuation of and claims priority to U.S. patent application Ser. No. 16/115,851 filed on Aug. 29, 2018, which claims benefit of priority under 35 U.S.C. § 119 to Korean Patent Application No. 10-2018-0010700 filed on Jan. 29, 2018 in the Korean Intellectual Property Office, the disclosure of which is incorporated herein by reference in its entirety.

BACKGROUND

1. Field

Example embodiments according to the present inventive concept relate to a semiconductor package including a semiconductor chip.

2. Description of Related Art

With the development of the electronics industry, there is growing demand for high-performance, high-speed and miniaturization of electronic components. In accordance with this trend, a package is commonly manufactured by mounting a plurality of semiconductor chips on a single interposer or a package substrate. A warpage phenomenon, in which a semiconductor package is bent, due to a difference in coefficients of thermal expansion (CTE) between individual components constituting the semiconductor package may occur, and a technique for controlling the warpage of the semiconductor package may be useful.

SUMMARY

Example embodiments provide a semiconductor package capable of controlling warpage.

According to an example embodiment, a semiconductor package includes a substrate having a first surface and a second surface opposing the first surface; a plurality of first pads disposed on the first surface of the substrate and a plurality of second pads disposed on the second surface of the substrate and electrically connected to the plurality of first pads; a semiconductor chip disposed on the first surface of the substrate and connected to the plurality of first pads; a dummy chip having a side surface facing one side surface of the semiconductor chip, disposed on the first surface of the substrate spaced apart from the semiconductor chip in a direction parallel to the first surface of the substrate, the dummy chip having an upper surface positioned lower than an upper surface of the semiconductor chip in a direction perpendicular to the first surface of the substrate; an underfill disposed between the semiconductor chip and the first surface of the substrate, and having an extension portion extended along the facing side surfaces of the semiconductor chip and the dummy chip in the direction perpendicular to the first surface of the substrate, an upper end of the extension portion being disposed to be lower than the upper surface of the semiconductor chip; and a sealing material disposed on the first surface of the substrate, and sealing the semiconductor chip and the dummy chip.

According to an example embodiment, a semiconductor package includes a substrate having a first surface and a second surface opposing the first surface; a plurality of first pads disposed on the first surface of the substrate and a plurality of second pads disposed on the second surface of the substrate and electrically connected to the plurality of first pads; a first semiconductor chip disposed on the first surface of the substrate and connected to a first portion of the plurality of first pads; a second semiconductor chip disposed on the first surface of the substrate spaced apart from the first semiconductor chip in a direction parallel to the first surface of the substrate and connected to a second portion of the plurality of first pads, different from the first portion of the plurality of first pads; a dummy chip disposed on the first surface of the substrate to at least have a side surface facing one side surface of the first semiconductor chip, and having an upper surface lower than an upper surface of the first semiconductor chip in a direction perpendicular to the first surface of the substrate; an underfill disposed between the first and second semiconductor chips and the first surface of the substrate, and having an extension portion extended along the facing side surfaces of the first semiconductor chip and the dummy chip in the direction perpendicular to the first surface of the substrate, an upper end of the extension portion being disposed to be lower than upper surface of the first semiconductor chip; and a sealing material disposed on the first surface of the substrate, and sealing the first and second semiconductor chips and the dummy chip.

According to an example embodiment, a semiconductor package includes a substrate having a first surface and a second surface opposing the first surface; a plurality of first pads disposed on the first surface of the substrate and a plurality of second pads disposed on the second surface of the substrate and electrically connected to the plurality of first pads; a first semiconductor chip disposed on the first surface of the substrate and connected to a first portion of the plurality of first pads; a second semiconductor chip having a side surface facing one side surface of the first semiconductor chip, disposed on the first surface of the substrate, and having a mounting height in a direction perpendicular to the first surface of the substrate lower than a mounting height of the first semiconductor chip in the direction perpendicular to the first surface of the substrate; an underfill disposed between the first and second semiconductor chips and the first surface of the substrate, and having an extension portion extended along the facing side surfaces of the first and second semiconductor chips in the direction perpendicular to the first surface of the substrate, an upper end of the extension portion being disposed to be lower than the mounting height of the first semiconductor chip; and a sealing material disposed on the first surface of the substrate to seal the first and second semiconductor chips while covering the extension portion of the underfill, the sealing material having a thermal expansion coefficient lower than a thermal expansion coefficient of the underfill.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, example embodiments of the present inventive concept will be described with reference to the accompanying drawings.

Figure 1:
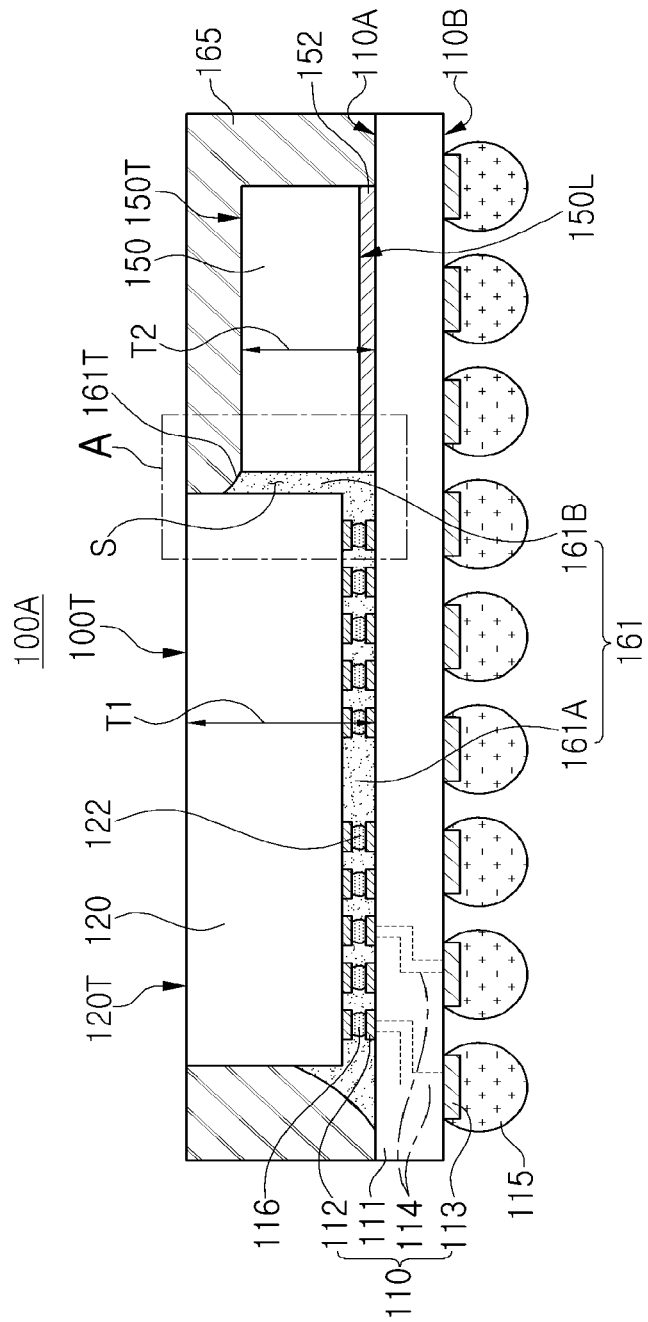
FIG. 1 is a cross-sectional side view illustrating a semiconductor package according to an example embodiment.
Figure 2:
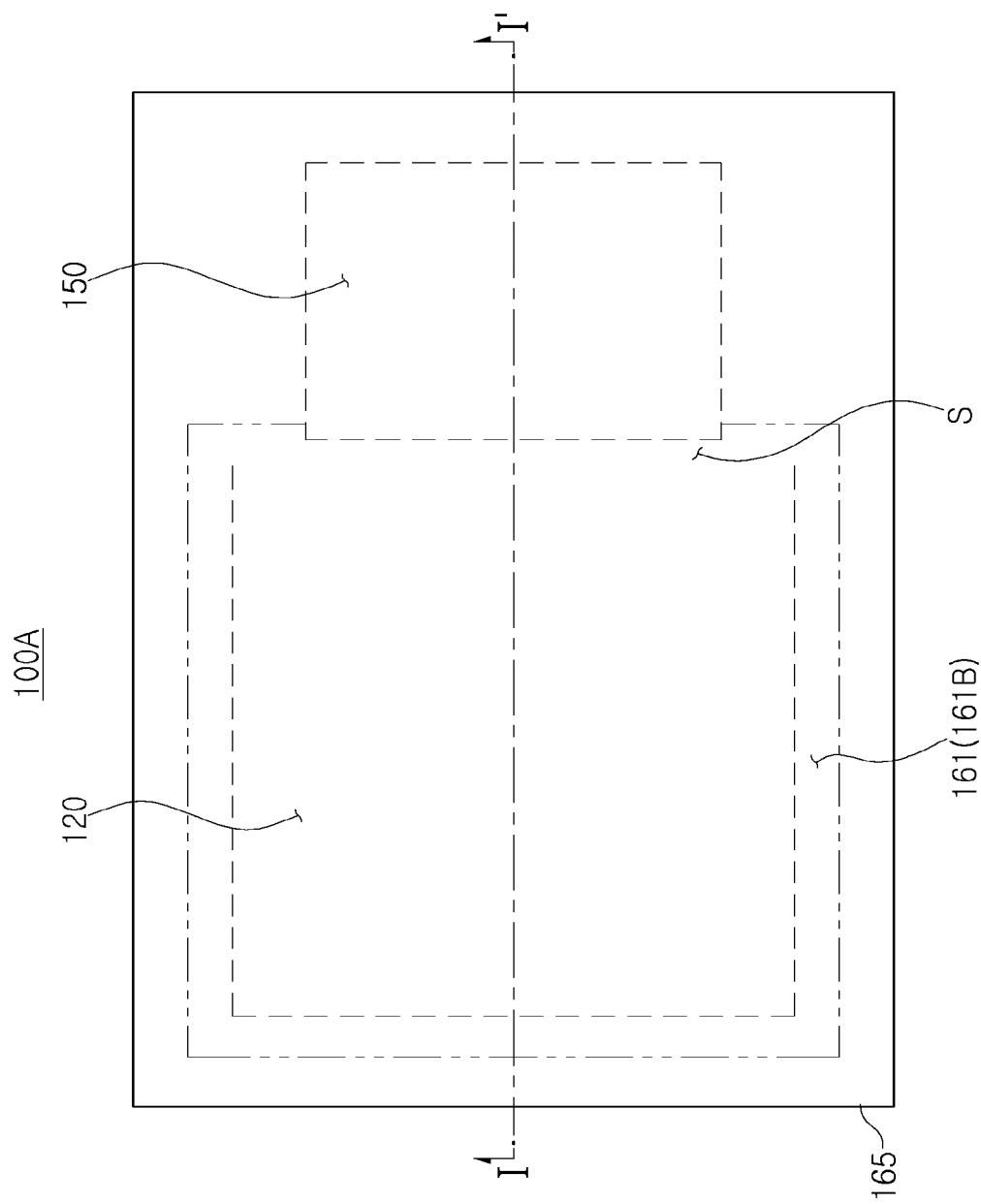
FIG. 2 is a plan view of the semiconductor package shown in FIG. 1.

FIG. 1 is a cross-sectional side view illustrating a semiconductor package according to an example embodiment, and FIG. 2 is a plan view of the semiconductor package shown in FIG. 1. For example, FIG. 1 is a cross-sectional view of the semiconductor package of FIG. 2 taken along line I-I'.

Referring to FIGS. 1 and 2, a semiconductor package 100A according to an example embodiment may include an interposer 110 having a first surface 110A (may also be referred to as upper surface of the interposer 110) and an opposing second surface 110B (may also be referred to as lower/bottom surface of the interposer 110), a semiconductor chip 120 and a dummy chip 150 disposed on the first surface 110A of the interposer 110, an underfill 161 disposed between the first surface 110A of the interposer 110 and the semiconductor chip 120, and a sealing material 165 covering the semiconductor chip 120 and the dummy chip 150. According to exemplary embodiments, the first surface 110A of the interposer 110 may face bottom surfaces of the semiconductor chip 120 and the dummy chip 150 and the second surface 110B may face away from the bottom surfaces of the semiconductor chip 120 and the dummy the dummy chip 150. According to exemplary embodiments, the interposer 110 may be positioned above other (not shown) semiconductor chips within the same package.

The interposer 110 employed in this example embodiment may include a wiring circuit 114 formed in a base material 111, and a plurality of first pads 112 and a plurality of second pads 113, respectively, disposed on the first and second surfaces 110A and 110B, and connected to each other by the wiring circuit 114. In FIG. 1, the wiring circuit 114 may be represented by a dotted line in only a portion of an area, and may include each of the wiring circuits 114 associated with each of the first and second pads 112 and 113. According to exemplary the plurality of first pads 112 disposed on the first surface 110A of the interposer 110 are electrically connected to the plurality of second pads 113 disposed on the second surface 110B of the interposer 110 through the wiring circuit 114. As used herein, and unless indicated otherwise, items described as being "electrically connected" are configured such that an electrical signal can be passed from one item to the other.

According to exemplary embodiments, the dummy chip 150 may be monolithic block formed of a crystalline semiconductor material, such as a block of crystalline silicon and/or a block of a crystalline material which is the same as a crystalline material forming the substrate of semiconductor chip 120. Thus, the CTE of the dummy chip 150 and semiconductor chip 120 may be substantially the same (e.g., vary by less than 10%). In addition, according to exemplary embodiments, the dummy chip 150 may not be electrically connected to the wiring circuit 114. The dummy chip 150 may not include any integrated circuit formed therein. According to exemplary embodiments, the base material 111 of the interposer 110 may be a silicon substrate (e.g., monolithic crystalline silicon). In another example embodiment, the base material 111 is not limited thereto, and may be a printed circuit board (PCB). For example, the base material 111 may be a thermosetting resin such as an epoxy resin, or a thermoplastic resin such as polyimide, or a photosensitive insulating layer.

External terminals 115 may be provided on the plurality of second pads 113 disposed on the second surface 110B of the interposer 110. The external terminal 115 may include at least one metal of tin (Sn), lead (Pb), nickel (Ni), gold (Au), silver (Ag), copper (Cu), or bismuth (Bi), or alloys thereof.

The semiconductor chip 120 may have an active surface facing the first surface 110A of the interposer 110, and an inactive surface opposing the active surface facing away from the first surface 110A of the interposer 110. A connection pad 122 may be disposed on the active surface of the semiconductor chip 120. The connection pad 122 may include a connection electrode (not shown). A connection terminal 116 may be provided between the connection electrode of the connection pad 122 and the first pad 112 of the interposer 110, and the first semiconductor chip 120 may be flip-chip bonded to the first surface 110A of the interposer 110 through the connection terminal 116.

The dummy chip 150 employed in this example embodiment may be disposed on the first surface 110A of the interposer 110 spaced apart from the semiconductor chip 120 in a horizontal direction parallel to the first surface 110A to have a side surface facing one side surface of the semiconductor chip 120. According to exemplary embodiments, in a different way than the semiconductor chip 120, the dummy chip 150 may be bonded to the first surface of the interposer 110 using an adhesive layer 152 such that an upper surface of the adhesive layer 152 contacts a bottom surface 150L of the dummy chip 150 (a surface of the dummy chip facing the first surface 110A of the interposer 110) and a bottom surface of the adhesive layer 152 contacts the first surface 110A of the interposer 110. According to exemplary embodiments, side surfaces of the dummy chip 150 may be in the same plane as the side surfaces of the adhesive layer 152 (e.g., these side surfaces may vertically align). According to exemplary embodiments, the bottom surface 150L of the dummy chip 150 may be positioned at a level lower than the bottom surface (here, the active surface) of the semiconductor chip 120 (level referring to a vertical level, with vertical referring to the direction perpendicular to the first surface 110A of the interposer 110). The upper surface 150T of the dummy chip 150 (the major surface of the dummy chip facing away the first surface 110A of the interposer 110) may be positioned at a level lower than the upper surface (in this example, the back side, inactive surface) of the semiconductor chip 120 (e.g., with respect to a direction perpendicular to the first surface 110A of the interposer 110). A non-conductive film (NCF), an anisotropic conductive film (ACF), a UV sensitive film, an instant adhesive, a thermosetting adhesive, a laser-curable adhesive, an ultrasonic curing adhesive, a nonconductive paste, or the like may be used as the adhesive layer 152. The adhesive layer may have a uniform thickness either throughout (e.g., when embodied as a film) and/or at all locations under the dummy chip 150. The adhesive layer may be formed of multiple layers of different materials or may be homogenous.

The dummy chip 150 may be disposed on the first surface 110A of the interposer 110, but in an empty area not occupied by the semiconductor chip 120, so that the dummy chip 150 may reduce a bending of the semiconductor package 100A. For a bending reduction effect, the dummy chip 150 may include a material having a relatively low modulus. For example, the dummy chip 150 may be composed of a material having a modulus lower than a modulus of the sealing material 165. According to exemplary embodiments, when the base material 111 of the interposer is composed of a semiconductor material such as silicon, the dummy chip 150 may be composed of the same or a similar material as that of the base material 111 of the interposer.

In this example embodiment, the dummy chip 150 may have a mounting height T2 of the semiconductor chip 120 in a direction perpendicular to the first surface 110A of the interposer 110 lower than a mounting height T1 of the semiconductor chip 120 in the direction perpendicular to the first surface 110A of the interposer 110. In a similar way, the upper surface 150T of the dummy chip 150 may be disposed to be lower than the mounting height T1 of the semiconductor chip 120 in the direction perpendicular to the first surface 110A of the interposer 110. The dummy chip 150 having such a relatively lower upper surface 150T may suppress an undesirable rise of the underfill 161 in a space S with the semiconductor chip 120. This will be described in detail with reference to FIGS. 1 and 3. For example, FIG. 3 is an enlarged cross-sectional view of an extension portion 161B of the underfill 161 in the semiconductor package 100A shown in FIG. 1.

The various pads of a device described herein may be conductive terminals connected to internal wiring and/or logic circuits of the device, and may transmit signals and/or supply voltages between an internal wiring and/or internal circuit of the device and an external source. For example, connection pads 122 disposed on the active surface of the semiconductor chip 120 may electrically connect to and transmit supply voltages and/or signals between an integrated circuit of the semiconductor chip 120 and a device to which the semiconductor chip 120 is connected.

Figure 3:
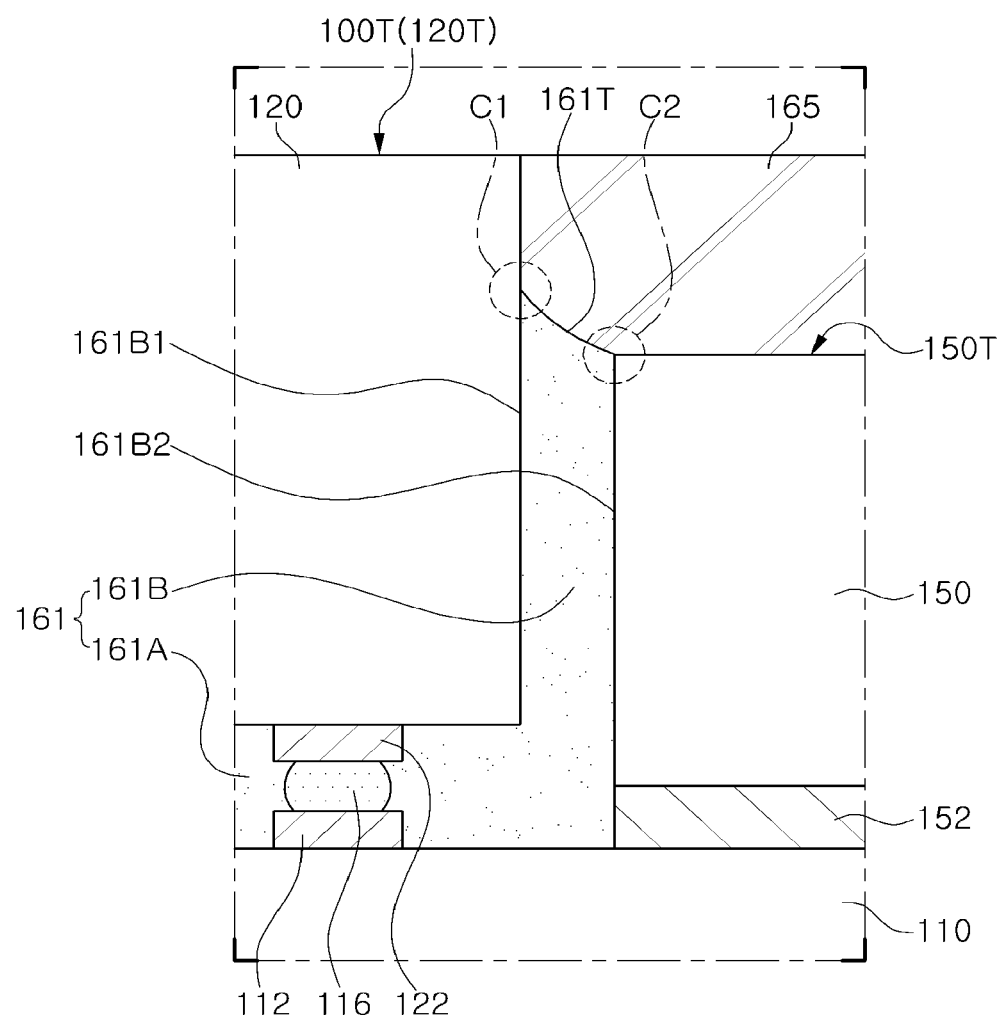
FIGS. 3 and 4 are enlarged cross-sectional views of a portion of the semiconductor package shown in FIG. 1.

Referring to FIGS. 1 and 3, the underfill 161 may fill a space between the semiconductor chip 120 and the first surface 110A of the interposer 110, for example, a space between the connection terminals 116 connecting between the connection pad 122 of the semiconductor chip 120 and the first pad 112 of the interposer 110. The underfill 161 may be partially extended from the semiconductor chip 120, and extended along the side surface of the semiconductor chip 120. Particularly, the underfill 161 may be extended along a space S between the facing side surfaces of the semiconductor chip 120 and the dummy chip 150.

In a similar way, the underfill 161 employed in this example embodiment may have a portion 161B (may also be referred to as an extension portion) extended along the facing side surfaces of the semiconductor chip 120 and the dummy chip 150, together with a main portion 161A between the semiconductor chip 120 and the first surface 110A of the interposer 110. The extension portion 161B and the main portion 161A of the underfill may have the same material composition.

The extension portion 161B of the underfill 161 may be disposed lower in a direction perpendicular to the first surface 110A of the interposer 110 such that an upper end 161T of the extension portion 161B does not reach an upper surface 100T of the package 100A and that the dummy chip 150 having the upper surface 150T being positioned lower than the mounting height T1 of the semiconductor chip 120. Normally, although the extension portion 161B of the underfill 161 is raised between narrow spaces S during underfill formation (for example, before curing), so that the position of an upper end 161T thereof is formed higher by a capillary phenomenon, according to this example embodiment, this may be controlled to be lower by the dummy chip 150 having the upper surface 150T lower than an upper surface 120T of the semiconductor chip 120.

In a similar way, the upper end 161T of the extension portion 161B may be controlled by the relatively low upper surface 150T of the dummy chip 150 to have a unique profile. For example, as shown in FIG. 3, in the extension portion 161B, a level of a point C2 contacting the dummy chip 150 may be lower than a level of a point C1 contacting the semiconductor chip 120. For example, the extension portion 161B may include a first side surface 161B1 contacting a side surface of the semiconductor chip 120 and a second side surface 161B2 opposite to first side surface 161B1 contacting a side surface of the dummy chip 150 and the side surface of the semiconductor chip 120 faces the side surface of the dummy chip 150. According to exemplary embodiments, the uppermost point (e.g., point C1) of the first side surface 161B1 of the extension portion 161B contacting the side surface of the semiconductor chip 120 may be positioned higher in a direction perpendicular to the first surface 110A of the interposer 110 than the uppermost point (e.g., point C2) of the second side surface 161B2 of the extension portion 161B contacting the side surface of the dummy chip 150 in the direction perpendicular to the first surface 110A of the interposer 110.

Although the level of the point C1 contacting the dummy chip 150 in the extension portion 161B is illustrated in the form in which it is maintained substantially equal to a level of the upper surface 150T of the dummy chip 150, the upper end 161T of the extension portion 161B in this example embodiment may have different profiles, depending on an amount, a shape of a space S, or the like in the underfill 161. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

Figure 4:
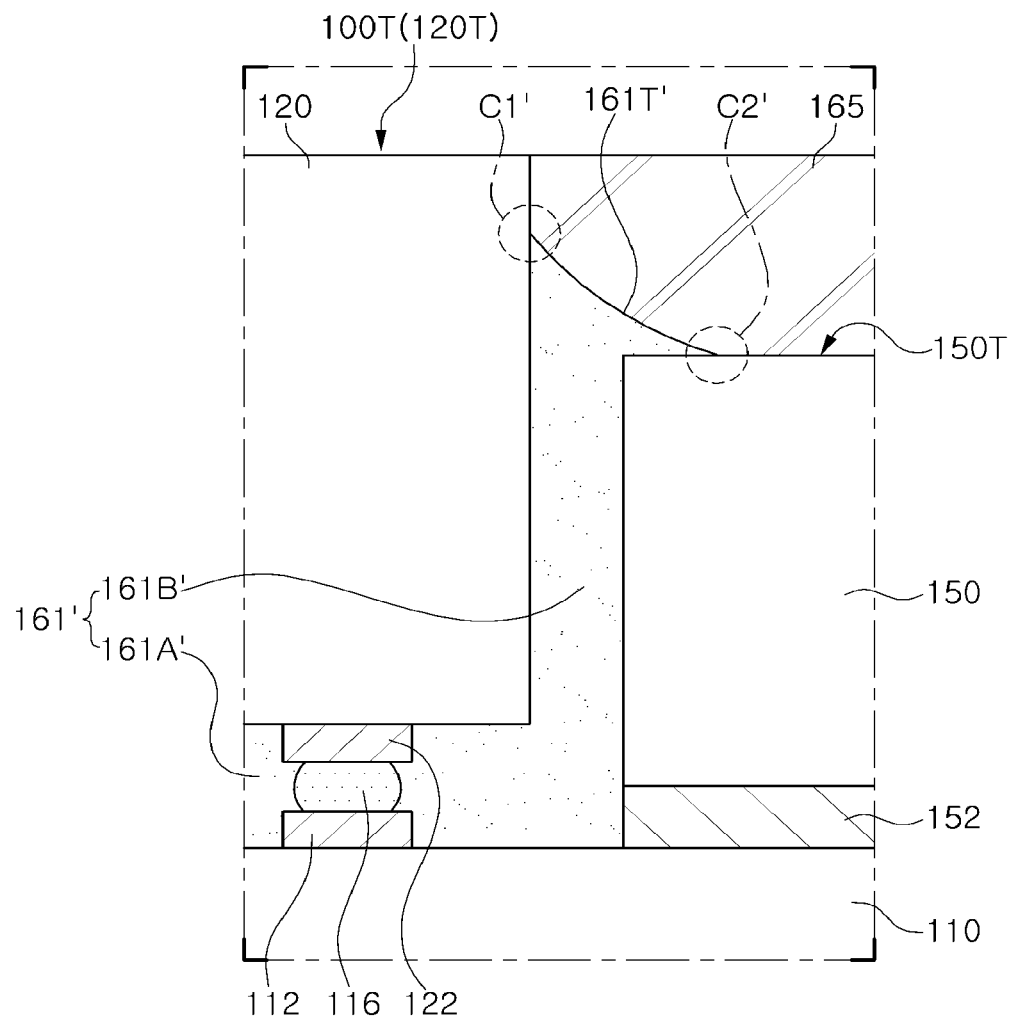

For example, when an amount of the underfill to be supplied in the package of the same structure is larger than that of FIG. 3, the large amount of the underfill may be also injected into a space S between the semiconductor chip 120 and the dummy chip 150. As a result, the upper end 161T of the extension portion 161B of the underfill 161 may cover a portion of the upper surface 150T of the dummy chip 150 as shown in FIG. 4. A height of the upper end 161T of the extension portion 161B may be kept low by the relatively low upper surface 150T of the dummy chip 150.

As described above, the extension portion 161B of the underfill 161 may have various shapes.

The underfill 161 may have a thermal expansion coefficient higher than a thermal expansion coefficient of the sealing material 165. In another example embodiment, the underfill 161 may have a modulus (or rigidity) lower than a modulus (or rigidity) of the sealing material 165.

Under these conditions, the extension portion 161B of the underfill 161 may act as an inflection point, and warpage may be more seriously occurred along a boundary between the semiconductor chip 120 and the dummy chip 150. On the other hand, according to exemplary embodiments described above, by maintaining the upper end 161T of the extension portion 161B at a lower level, warpage problem caused by the underfill 161 may be reduced.

The underfill 161 may include an underfill resin such as an epoxy resin. In a specific example embodiment, the underfill 161 may include a silica filler or flux. For example, the sealing material 165 may include a resin such as an EMC (Epoxy Molding Compound). The underfill 161 may be formed of a material similar to the sealing material 165 formed at an outer periphery, but it may have a relatively higher fluidity to effectively fill a small space. In this example embodiment, the modulus of the underfill 161 may be lower than the modulus of the sealing material 165. In another example embodiment, the thermal expansion coefficient of the underfill 161 may be higher than the thermal expansion coefficient of the sealing material 165.

In a specific example embodiment, when the underfill 161 is formed of the same or a similar resin as the sealing material 165, the type and amount (for example, density) of the filler to be contained may have a modulus lower than the modulus of the sealing material 165.

Since the upper end 161T of the extension portion 161B is kept lower than the upper surface 120T of the semiconductor chip 120 as shown in FIGS. 1 and 3, the sealing material 165 may cover the extension portion 161B of the underfill 161. Warpage problem occurred at the boundary between the semiconductor chip 120 and the dummy chip 150 may be reduced by the sealing material 165 having rigidity higher than that of the underfill 161.

The sealing material 165 may be disposed on the first surface 110A of the interposer 110, and may be provided to surround the semiconductor chip 120 and the dummy chip 150. As shown in FIG. 1, the sealing material 165 may be formed to have an upper surface substantially coplanar with the upper surface 120T of the semiconductor chip 120, while covering the upper surface 150T of the dummy chip 150. After covering the semiconductor chip 120 and the dummy chip 150 with the sealing material 165, and, by grinding the upper regions of the package to expose the upper surface 120T of the semiconductor chip 120, a planar upper surface 100T of the semiconductor package 100A may be obtained.

Figure 5:
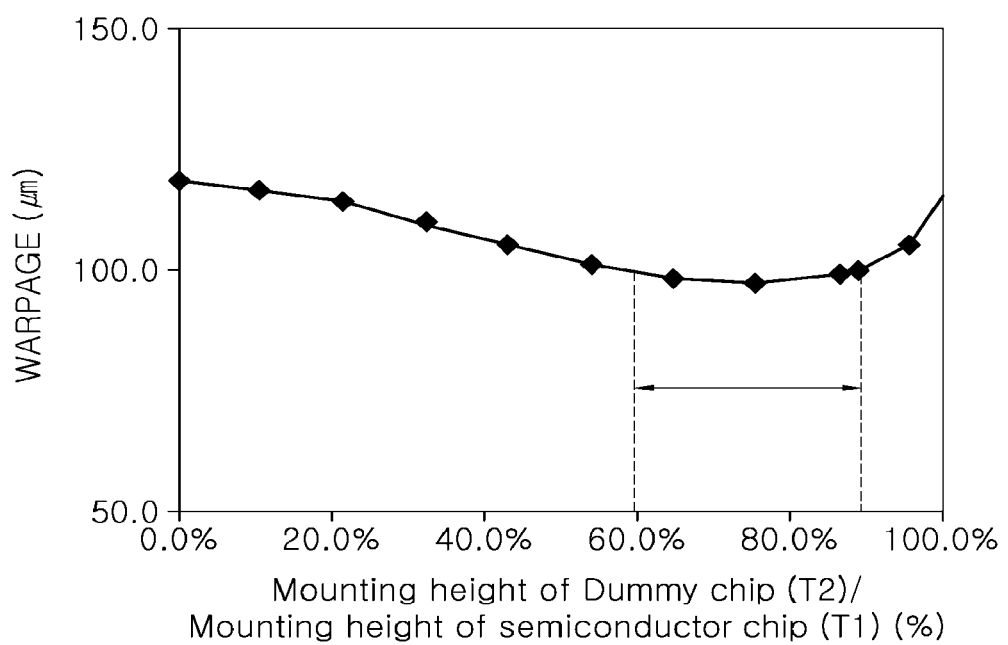
FIG. 5 is a graph showing effects of improving warpage according to a mounting height of a dummy chip.

FIG. 5 is a graph showing effects of improving warpage according to a mounting height of a dummy chip.

Referring to FIG. 5, a change in warpage may be measured while gradually changing a ratio of a mounting height T2 of the dummy chip to a mounting height T1 of the semiconductor chip, to confirm effects of improving a change in the mounting height T2 of the dummy chip.

In the package in which a dummy chip is not present (0%), warpage may be present in an amount as large as 120 μm or more. By adopting the dummy chip, warpage of the semiconductor package is improved. As the mounting height T2 of the dummy chip (for example, the thickness of the semiconductor package) increases, rigidity may be secured, and warpage of the semiconductor package may be gradually decreased, for example, to be less than 100 μm. On the other hand, when the mounting height T2 of the dummy chip increases, warpage may be increased again. When the mounting height T2 of the dummy chip in the package is the same as the mounting height T1 of the semiconductor chip (100%), it is shown to be increased to 110 μm.

When the mounting height T2 of the dummy chip is in the range of 60% to 90% of the mounting height T1 of the semiconductor chip, effects of improving warpage may be clearly shown at a level of 100 μm or less.

As described in the foregoing embodiments, a sufficient warpage effect may be expected by lowering the mounting height T2 of the dummy chip to 90% of the mounting height T1 of the semiconductor chip. On the other hand, when the mounting height T2 of the dummy chip is less than 60% of the mounting height (T1) of the semiconductor chip, the effect of improving warpage by the dummy chip itself may be reduced, and thus a sufficient warpage effect as a whole may not be expected. Therefore, by controlling the extension portion of the underfill, the mounting height T2 of the dummy chip with respect to the mounting height T1 of the semiconductor chip may be in the range of 60% to 90% to obtain a sufficient warpage improvement effect.

Figure 6:
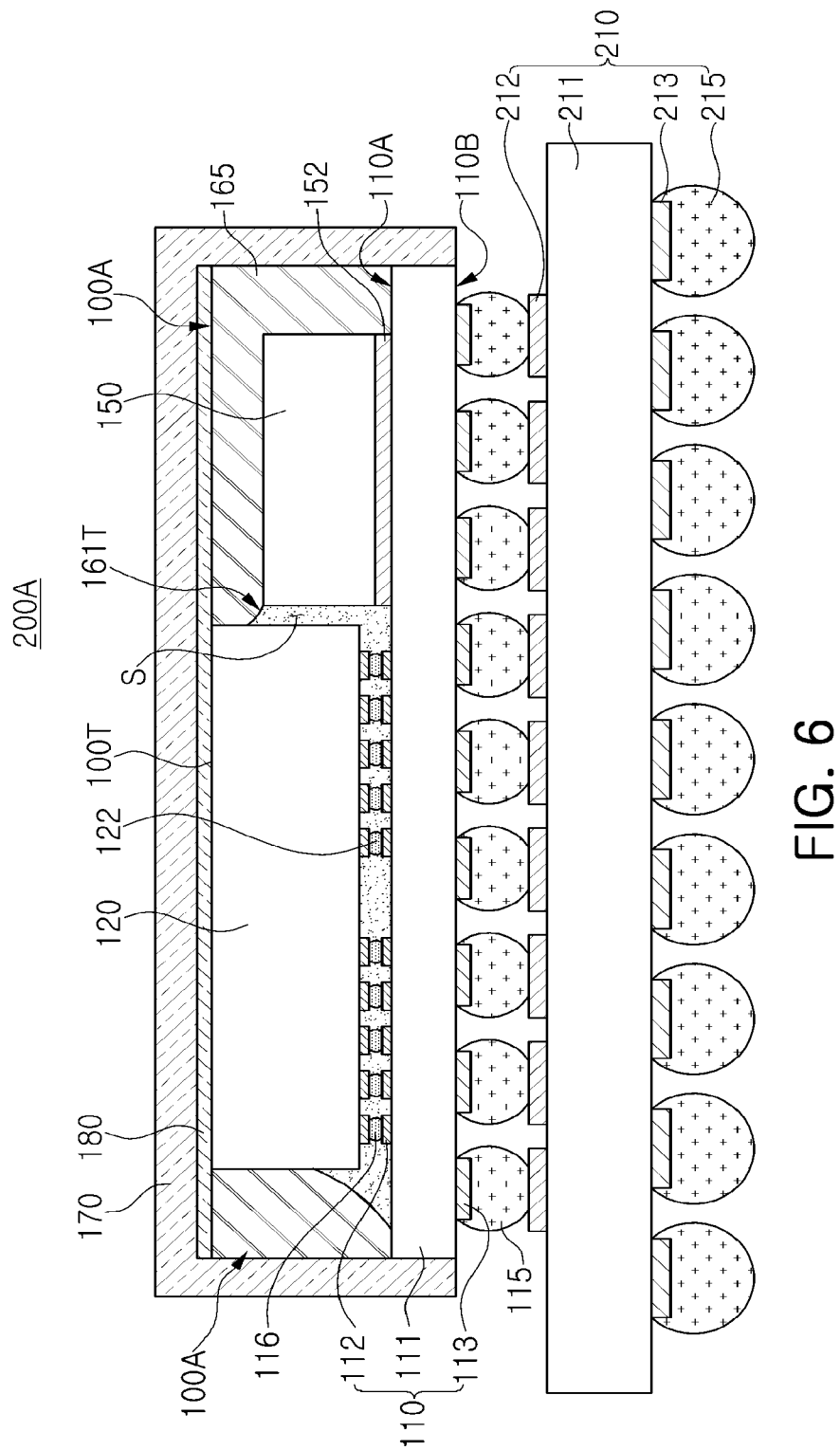
FIG. 6 is a cross-sectional side view illustrating a module employing the semiconductor package shown in FIG. 1.

FIG. 6 is a cross-sectional side view illustrating a module employing the semiconductor package shown in FIG. 1.

Referring to FIG. 6, a semiconductor package module 200A according to this example embodiment includes the semiconductor package 100A shown in FIG. 1, and a package substrate 210 on which the semiconductor package is mounted. The semiconductor package module 200A may be a completed package, and the semiconductor package 100A illustrated in FIG. 1 may be considered as an intermediate result for the semiconductor package module 200A.

The package substrate 210 may include an upper surface pad 212 disposed on an upper surface thereof and connected to a second pad of the interposer 110, a lower surface pad 213 disposed on a lower surface thereof and having an external connection terminal 215 formed thereon for connecting the semiconductor package module 200A to a device external to the semiconductor package module 200A, and a redistribution layer (RDL, not shown) connecting between the upper surface pad 212 and the lower surface pad 213. The redistribution layer not illustrated in the drawings can be understood as a wiring circuit composed of a plurality of vias and conductive patterns.

The upper surface pad 212 may be formed to correspond to the size and arrangement of the second pad 113 of the interposer 110, and the lower surface pad 213 may be formed to expand the size and space of a pad to fit I/O terminals of a circuit, such as a motherboard, and such redistribution circuit may be realized by the redistribution layer of the package substrate 210. An external connection terminal 215, such as a solder bump, for connecting to an external circuit may be disposed on the lower surface pad 213. For example, the external connection terminal 215 may include at least one metal of tin (Sn), lead (Pb), nickel (Ni), gold (Au), silver (Ag), copper (Cu), or bismuth (Bi), or alloys thereof.

The semiconductor package module 200A according to this example embodiment may include at least a heat sink portion 170 disposed on the upper surface of the semiconductor package 100A. The heat sink portion 170 employed in this example embodiment may include shapes extended to the side surface of the semiconductor package 100A in the form of a cap structure. The heat sink portion 170 may be bonded to the upper surface 100T of the semiconductor package 100A using a bonding member 180. In this example embodiment, heat occurred in the semiconductor chip 120 may be emitted to the heat sink portion 170 disposed adjacent thereto.

For example, the heat sink portion 170 may include materials having a good thermal conductivity such as a metal or a ceramic. In addition, the heat sink portion 170 may be a structure including a thermal interface material (TIM). For example, an NCF, an ACF, a UV sensitive film, an instant adhesive, a thermosetting adhesive, a laser-curable adhesive, an ultrasonic curing adhesive, an NCP, or the like may be used as the bonding member 180.

Figure 7:
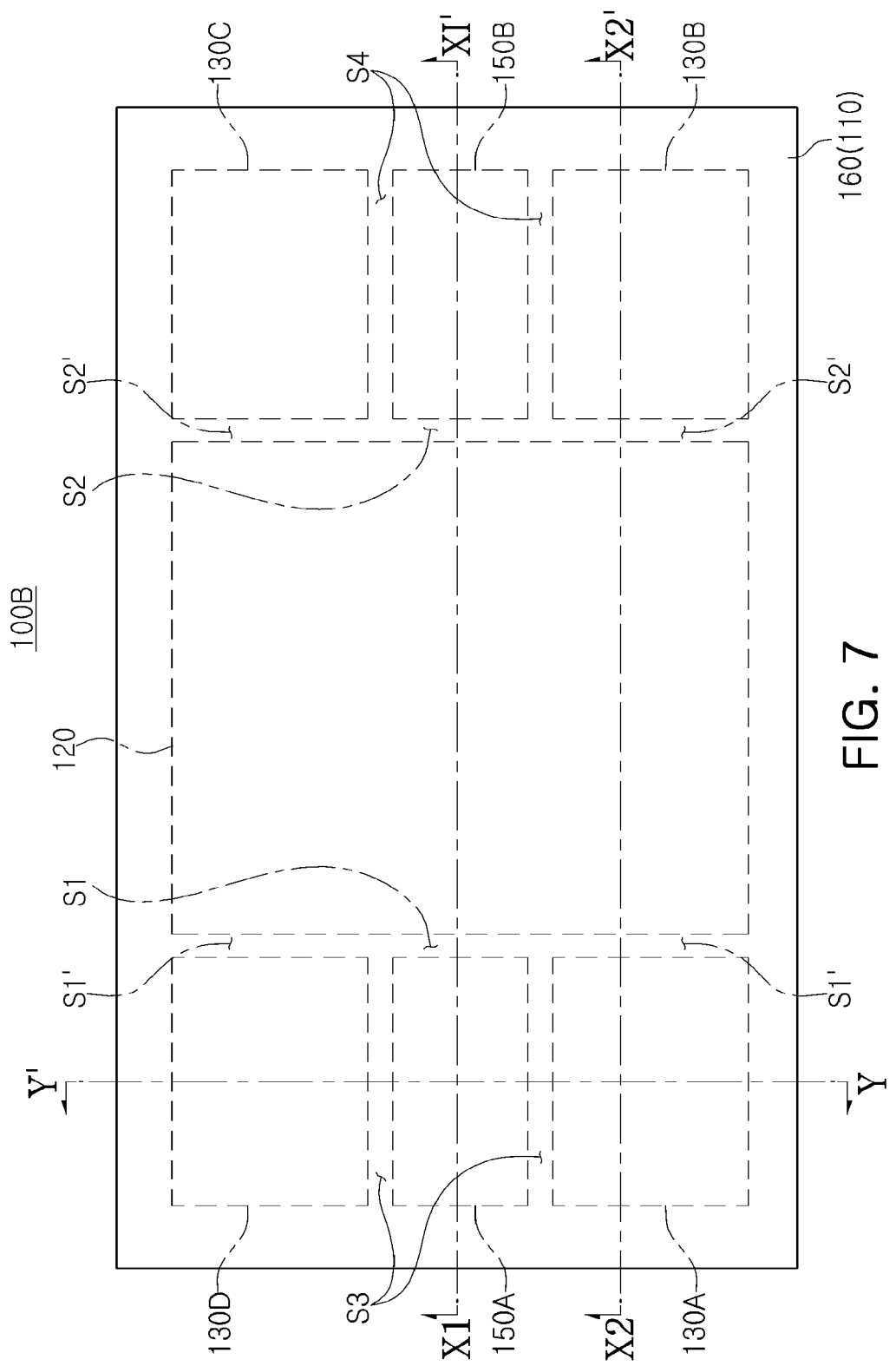
FIG. 7 is a plan view of a semiconductor package according to an example embodiment.
Figure 8:
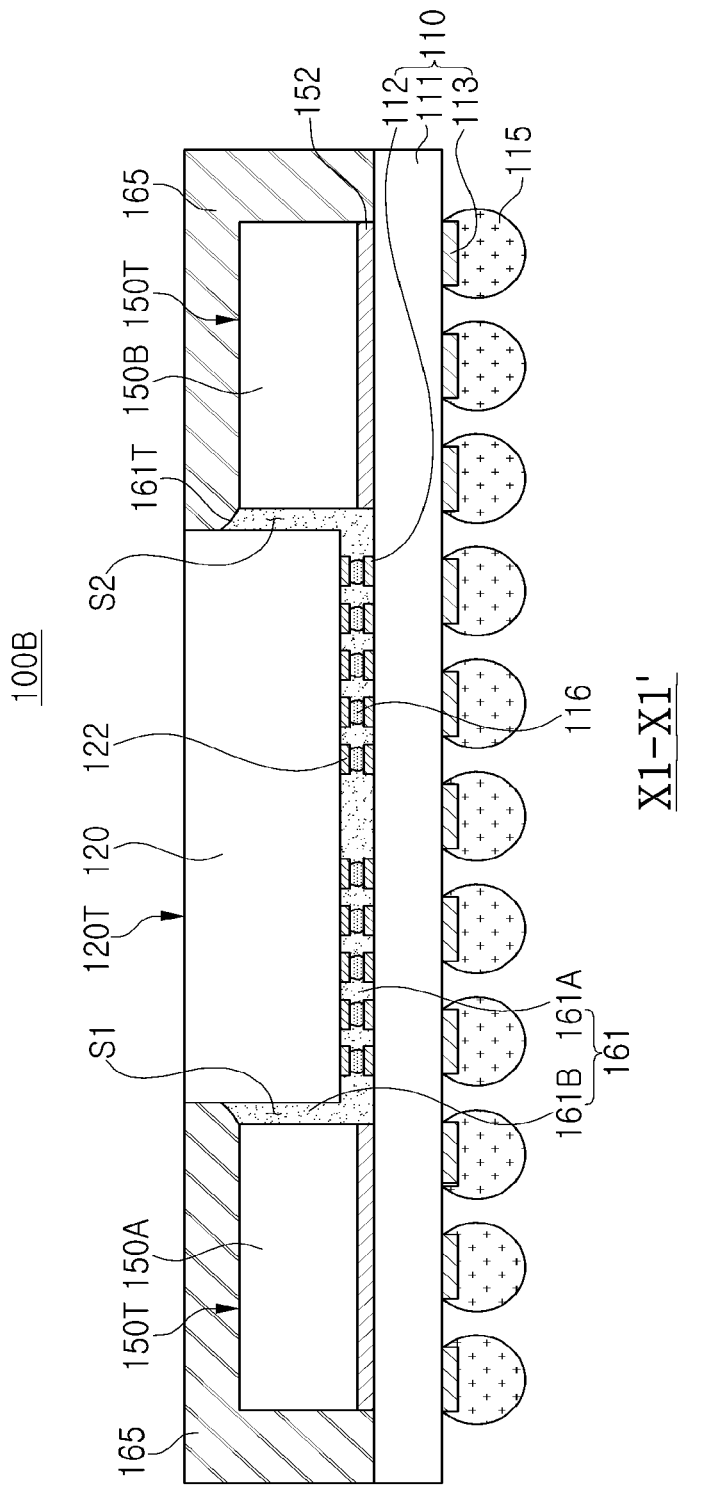
FIG. 8 is a cross-sectional side view of the semiconductor package shown in FIG. 7 taken along line X1-X1'.
Figure 9:
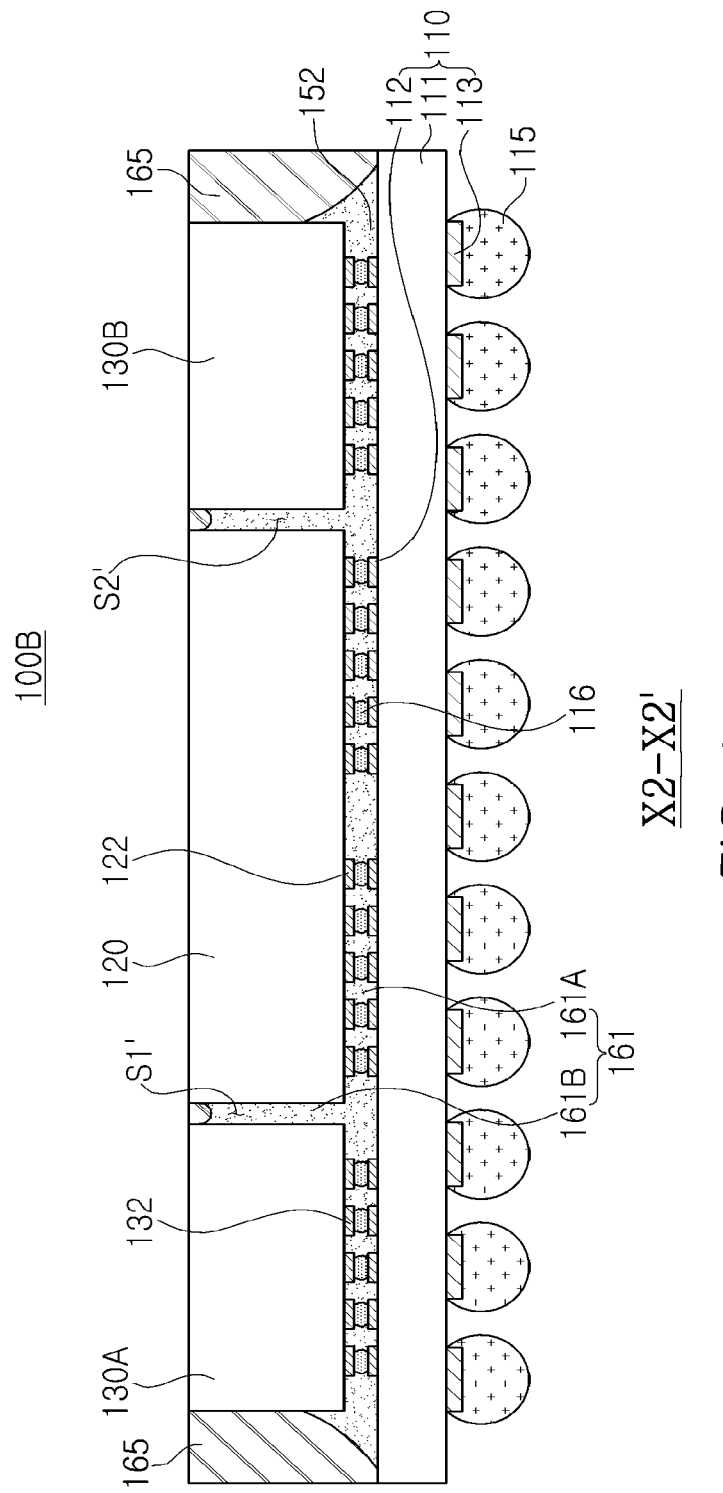
FIG. 9 is a cross-sectional side view of the semiconductor package shown in FIG. 7 taken along line X2-X2'.
Figure 10:
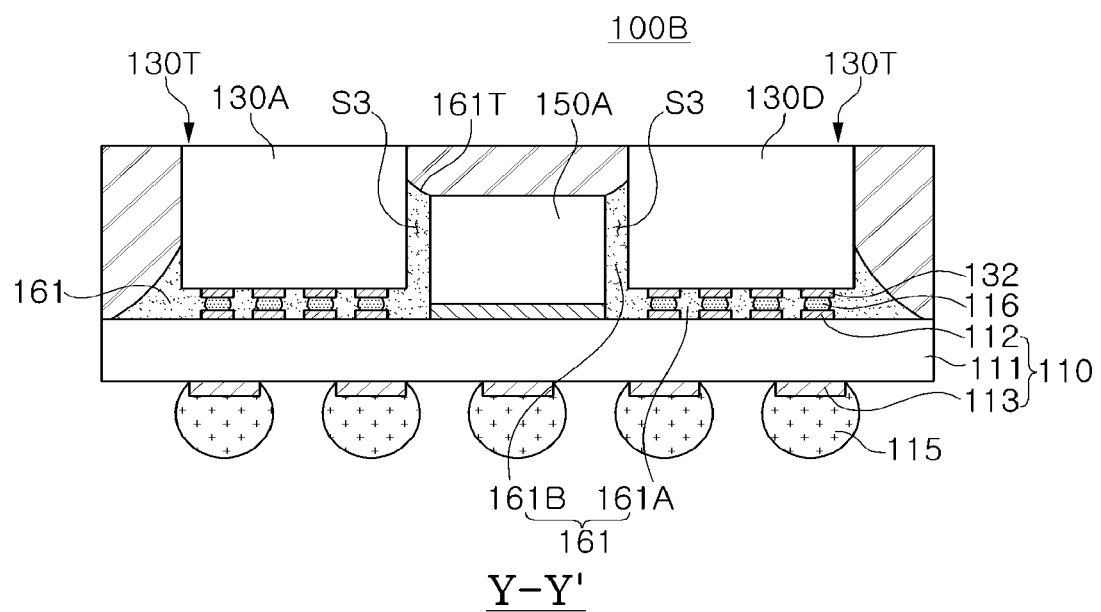
FIG. 10 is a cross-sectional side view of the semiconductor package shown in FIG. 7 taken along line Y-Y'.

FIG. 7 is a plan view of a semiconductor package according to an example embodiment. FIGS. 8 to 10 are cross-sectional side views of the semiconductor package shown in FIG. 7 taken along lines X1-X1', X2-X2' and Y-Y', respectively.

Referring to FIGS. 7 and 8, it can be understood that a semiconductor package 100B according to this example embodiment may include a first semiconductor chip 120 and a plurality of second semiconductor chips 130A, 130B, 130C, and 130D, and be similar to the semiconductor package 100A shown in FIG. 1, except that two dummy chips are employed. The description of the components of this example embodiment may be the same as the description of the same or similar components of the semiconductor package 100A shown in FIGS. 1 to 4, unless otherwise specified.

The semiconductor package 100B according to this example embodiment may include a first semiconductor chip 120 and four second semiconductor chips 130A, 130B, 130C, and 130D disposed around the first semiconductor chip. As shown in FIG. 7, the four second semiconductor chips 130A, 130B, 130C, and 130D may be disposed in two at both corners of the first semiconductor chip 120, respectively.

Similar to the first semiconductor chip 120, the second semiconductor chips 130A, 130B, 130C, and 130D may be bonded to the connection pad 132 and the first pad 112 of the interposer 110 by a connection terminal 116.

The semiconductor package 100B according to this example embodiment may include two dummy chips 150A and 150B at both corners of the first semiconductor chip 120. Each of the dummy chips 150A and 150B may be disposed on the first surface 110A of the interposer 110 to face the side surfaces of the first semiconductor chip 120 each other between the two second semiconductor chips 130A and 130D, or the two second semiconductor chips 130B and 130C.

The first semiconductor chip 120 may include a logic chip. For example, the first semiconductor chip 120 may include a controller or a microprocessor including a logic device.

The second semiconductor chip may include a memory chip such as a DRAM, an SRAM, a flash, a PRAM, a ReRAM, an FeRAM, or an MRAM. For example, the second semiconductor chips (130A, 130B, 130C, 130D) may be a high-band memory (HBD) chip including a memory stack connected in a TSV structure.

Referring to FIG. 8, an underfill 161 may fill a space between the first semiconductor chip 120 and the second semiconductor chips 130A, 130B, 130C, and 130D, and the first surface 110A of the interposer 110, and may be partially extended from the first semiconductor chip 120, and extended along facing side surfaces of the first semiconductor chip 120 and the dummy chips 150A and 150B. For example, the underfill 161 may have an extension portion 161B formed along spaces S1 and S2 between the first semiconductor chip 120 and the dummy chips 150A and 150B.

In this example embodiment, the dummy chips 150A and 150B have a mounting height lower than the mounting height of the first semiconductor chip 120. The relatively lower upper surface 150T of the dummy chips 150A and 150B may suppress the undesirable rise of the underfill 161 in the spaces S1 and S2 with the first semiconductor chip 120. As a result, the extension portion 161B of the underfill 161 may be maintained such that an upper end 161T thereof is lower than the upper surface 120T of the first semiconductor chip 120, as shown in FIG. 8.

Since the upper end 161T of the extension portion 161B is controlled by the relatively low upper surface 150T of the dummy chip 150, as above, a level of a point contacting the dummy chip 150 at the extension portion 161B may be lower than a level of a point contacting the first semiconductor chip 120 (see FIGS. 3 and 4). Further, in an alternative embodiment different from this example embodiment, the extension portion 161B of the underfill 161 may be partially extended to the upper surface 150T of the dummy chip 150 (see FIG. 4).

In this example embodiment, the second semiconductor chips 130A-130D may have a mounting height substantially equal to the mounting height of the first semiconductor chip 120. As shown in FIG. 9, in spaces S1' and S2' disposed between the first semiconductor chip 120 and the second semiconductor chips 130A-130D, the upper end 161T of the extension portion 161B may be formed at a relatively higher level close to the upper surface of the package. Nevertheless, as described above, since the extension portion 161B of the underfill 161 may be formed at a lower level in some regions (for example, regions represented by S1 and S2) as shown in FIG. 8, warpage caused by the underfill 161 occurred in the region along both corners of the first semiconductor chip 120 may be effectively reduced.

FIG. 10 is a cross-sectional view of the semiconductor package shown in FIG. 7 taken along line Y-Y'.

Referring to FIG. 10, the dummy chip 150A may have a mounting height lower than the mounting height of the two adjacent second semiconductor chips 130A and 130D. The relatively lower upper surface 150T of the dummy chip 150A may suppress an undesirable rise of the underfill 161 in the space S1 with the second semiconductor chip 130. As a result, as shown in FIG. 10, the extension portion 161B of the underfill 161 may be maintained such that the upper end thereof 161T is lower than the upper surface 130T of the second semiconductor chips 130A and 130D.

Since the upper end 161T of the extension portion 161B may be controlled by the relatively lower upper surface 150T of the dummy chip 150, as described above, a level of the point contacting the dummy chip 150 at the extension portion 161B may be lower than a level of the point contacting the second semiconductor chips 130A and 130D. Similarly, in a space S4 between the other dummy chip 150B and the second semiconductor chips 130B and 130C adjacent thereto, the extension portion 161B of the underfill 161 may be controlled by the relatively lower upper surface 150T of the dummy chip 150 to improve warpage.

The sealing material 165 may be disposed on the first surface 110A of the interposer 110 to provide a structure surrounding the first and second semiconductor chips 120 and 130A-130D, and the dummy chip 150. As shown in FIGS. 8 to 10, the sealing material 165 may be formed to cover the upper surface 150T of the dummy chip 150, but may be formed to have an upper surface substantially coplanar with the upper surfaces 120T and 130T of the first and second semiconductor chips. Through this structure, heat may be effectively emitted from the first and second semiconductor chips serving as a heat source.

Since the upper end 161T of the extension portion 161B is kept low in the regions S1, S2, S3, and S4 between the first and second semiconductor chips 120, 130A-130D and the dummy chip 150, the sealing material 165 may cover the extension portion 161B of the underfill 161. Therefore, by the sealing material 165 having stiffness higher than the underfill 161, warpage problem occurred in the regions S1, S2, S3, S4 between the first and second semiconductor chips 120, 130A-130D and the dummy chip 150 may be significantly reduced.

In a similar way, by lowering the mounting height of the dummy chips adjacent to the first and/or second semiconductor chips, deformation due to the underfill raised along the opposing side surfaces may be greatly mitigated.

Figure 11:
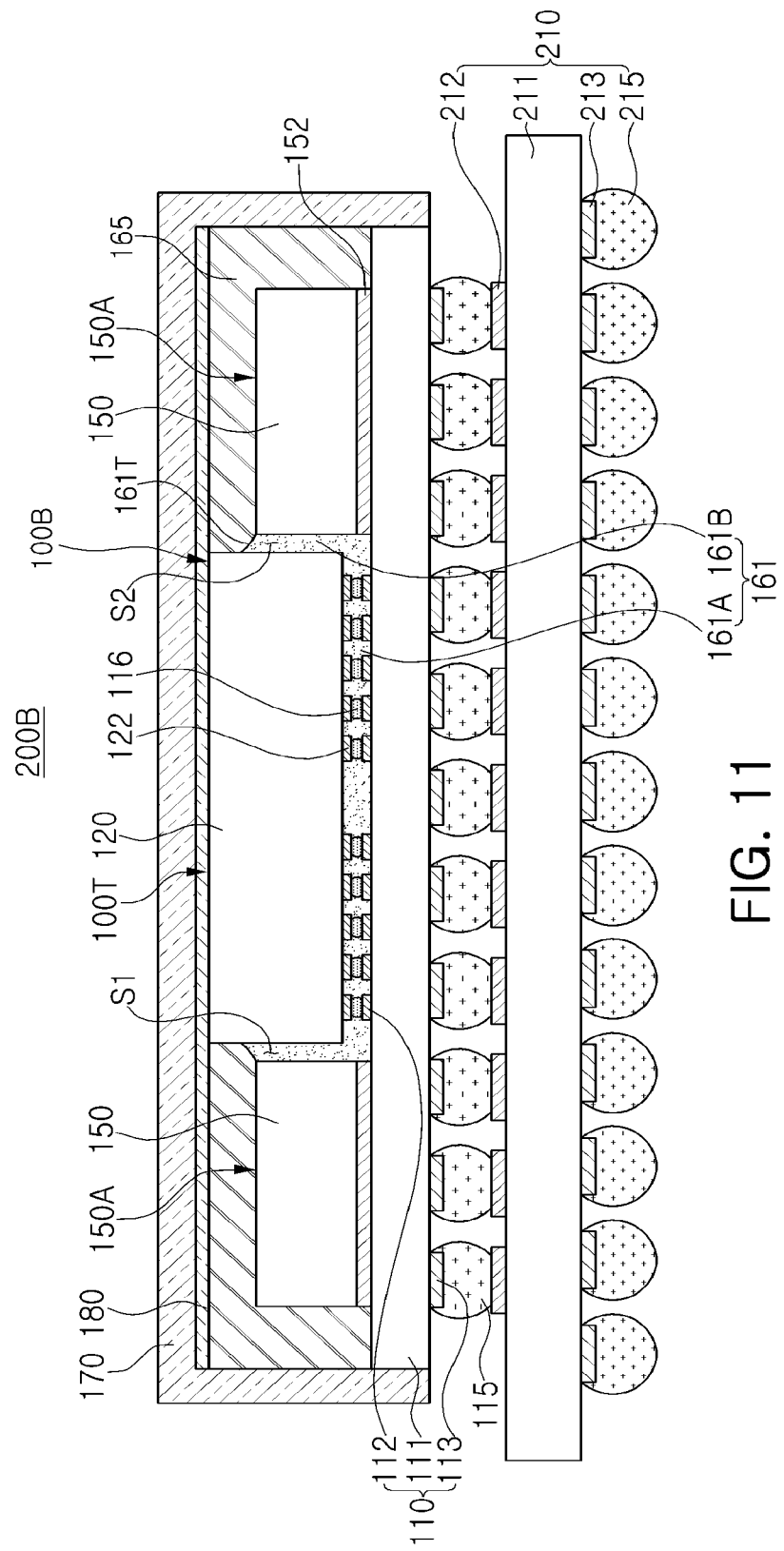
FIG. 11 is a cross-sectional side view illustrating a module employing the semiconductor package shown in FIG. 8.

FIG. 11 is a cross-sectional side view illustrating a module employing the semiconductor package shown in FIG. 8.

Referring to FIG. 11, it can be understood that the semiconductor package module 200B according to this example embodiment is similar to the module 200A shown in FIG. 6, except that the semiconductor package 100B shown in FIG. 8 is employed. The description of the components of this example embodiment may be referred to the description of the same or similar components of the semiconductor package module 200A shown in FIG. 6, unless otherwise specified.

The semiconductor package module 200B according to this example embodiment may include the semiconductor package 100B shown in FIG. 8 and the package substrate 210 on which the semiconductor package is mounted. The package substrate 210 may include an upper surface pad 212 connected to the second pad 113 of the interposer 110 by an external terminal 115, a lower surface pad 213, and a redistribution layer connecting the upper and lower surface pads 212 and 213 (not shown).

The semiconductor package module 200B according to this example embodiment may include a heat sink portion 170 disposed on the upper surface and side surface of the semiconductor package 100B. Since the upper surfaces of the first semiconductor chip 120 and the second semiconductor chips 130A-130D may be exposed on the upper surface of the package 100B, heat occurred by the first semiconductor chip 120 and the second semiconductor chips 130A-130D may be effectively emitted to an adjacent heat sink portion 170.

According to the proposal to control warpage problem by the underfill, when a plurality of semiconductor chips are employed, a similar effect may be expected by changing a mounting height (for example, a thickness) of some semiconductor chips rather than dummy chips.

Figure 12:
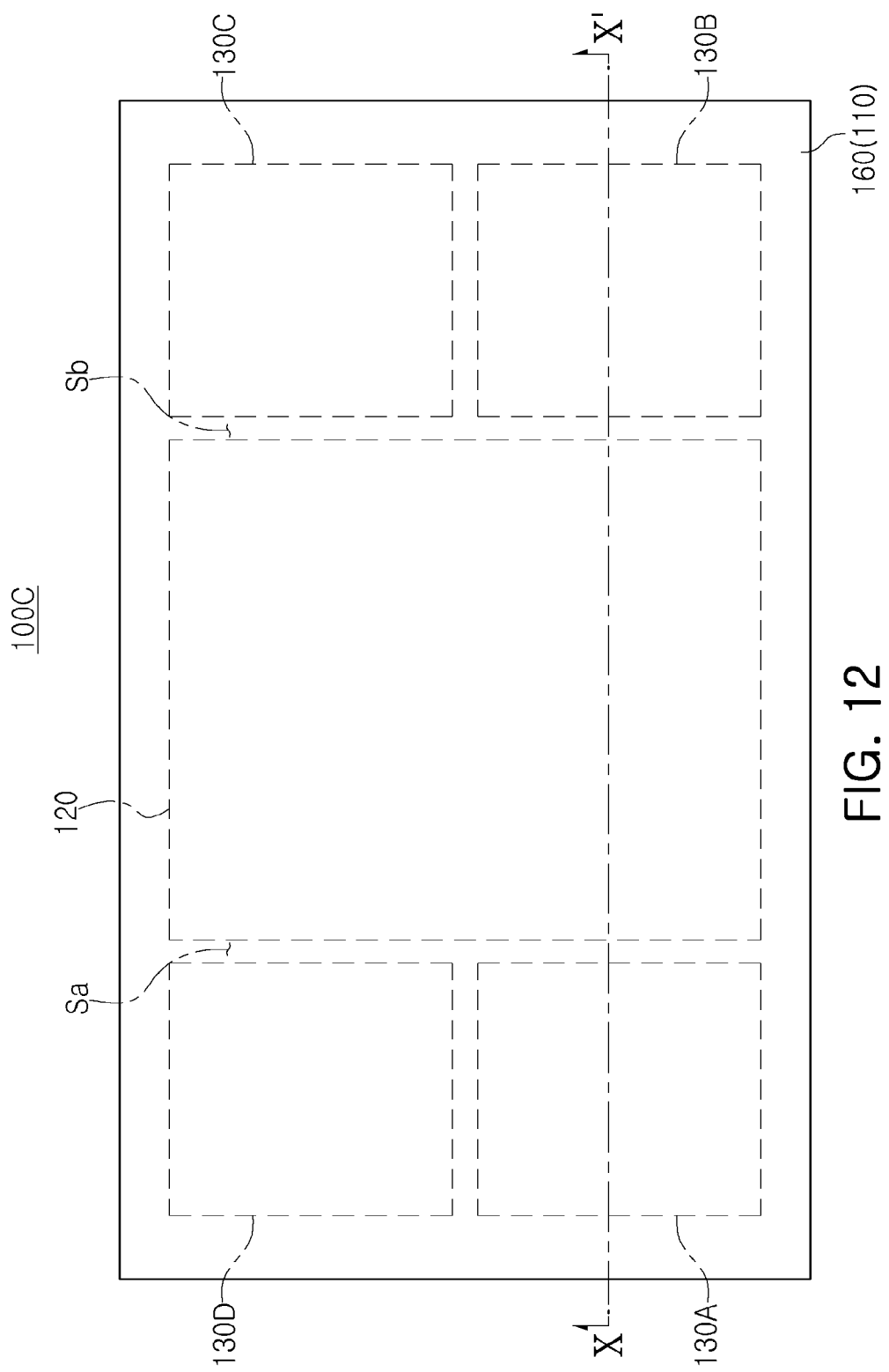
FIG. 12 is a plan view of a semiconductor package according to an example embodiment.
Figure 13:
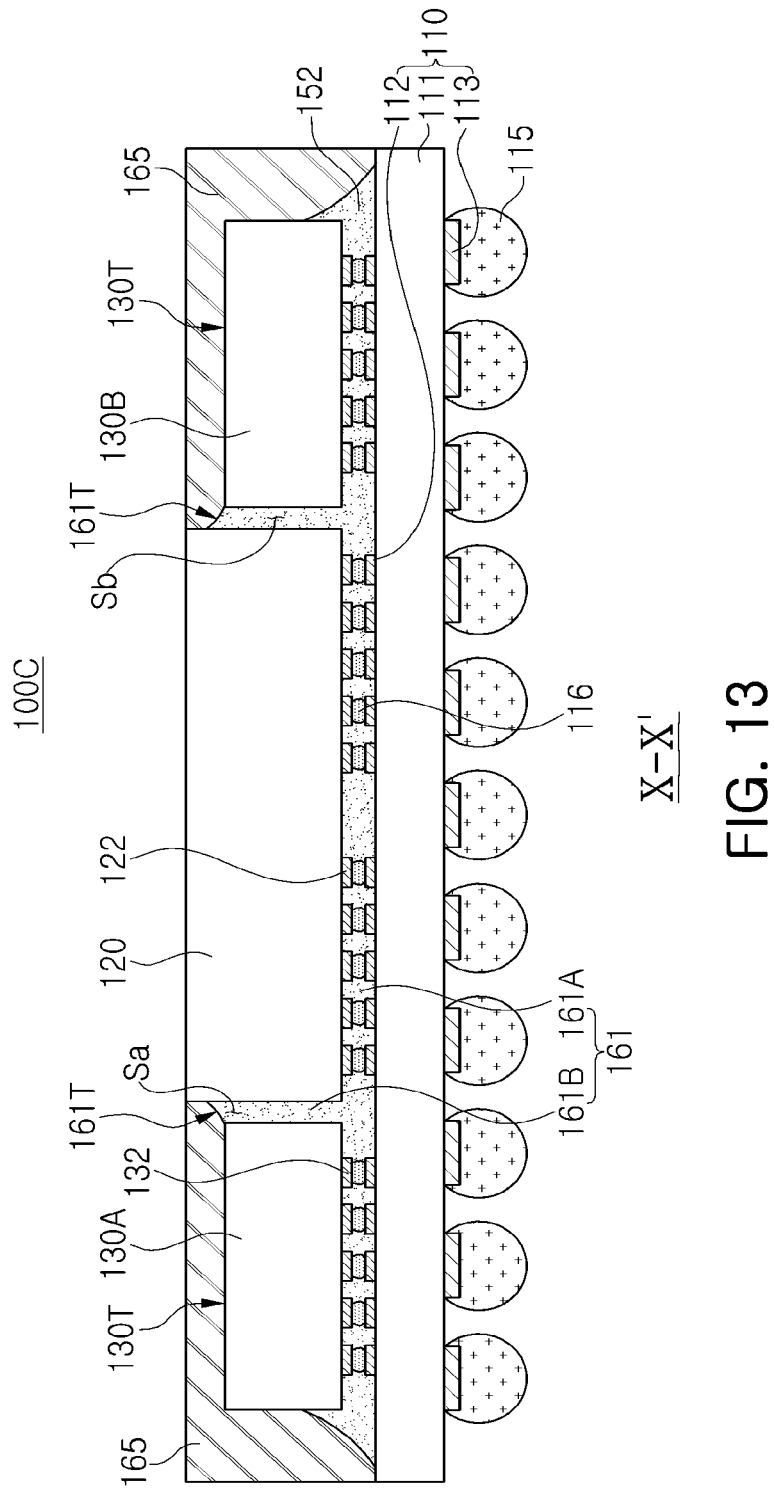
FIG. 13 is a cross-sectional side view of the semiconductor package shown in FIG. 12 taken along line X-X'.

FIG. 12 is a plan view of a semiconductor package according to an example embodiment, and FIG. 13 is a cross-sectional side view of the semiconductor package shown in FIG. 12 taken along line X-X'.

Referring to FIGS. 12 and 13, the semiconductor package 100C according to this example embodiment may not use a dummy chip, and may be similar to the semiconductor package 100B shown in FIGS. 7 and 8, except that a thickness of the first semiconductor chip 120 and a thickness of the second semiconductor chips 130A-130D are different. The description of the components of this example embodiment will be referred to the explanations of the same or similar components of the semiconductor package 100A shown in FIGS. 1 and 2 and the semiconductor package 100B shown in FIGS. 7 and 8, unless otherwise specified.

The second semiconductor chips 130A-130D may be disposed at both corners of the first semiconductor chip 120. The underfill 161 may fill a space between the first semiconductor chip 120 and the second semiconductor chips 130A, 130B, 130C, and 130D and the first surface 110A of the interposer 110, and may be partially extended from the chip 120 and extended along facing sides of the first semiconductor chip 120 and the second semiconductor chips 130A-130D. For example, the underfill 161 may have an extension portion 161B formed along spaces Sa and Sb between the first semiconductor chip 120 and the second semiconductor chips 130A-130D.

In this example embodiment, the second semiconductor chips 130A-130D employed in this example embodiment may have a mounting height lower than the mounting height of the first semiconductor chip 120. The relatively lower upper surface 130T of the second semiconductor chips 130A-130D may suppress an undesired rise of the underfill 161 in the spaces Sa and Sb with the first semiconductor chip 120. As a result, the extension portion 161B of the underfill 161 may be maintained to be lower than the upper surface 120T of the first semiconductor chip 120, with an upper end 161T thereof, as shown in FIG. 13.

In a similar way, since the upper end 161T of the extension portion 161B is controlled by the relatively lower upper surface 130T of the second semiconductor chips 130A-130D, in the extension portion 161B, a level at the point contacting the second semiconductor chips 130A-130D may be lower than a level at the point contacting the first semiconductor chip 120 (see FIGS. 3 and 4). In addition, in an alternative embodiment different from this example embodiment, the extension portion 161B of the underfill 161 may be partially extended to the upper surface 130T of the second semiconductor chips 130A-130D (see FIG. 4).

The sealing material 165 may be disposed on the first surface 110A of the interposer 110 to provide a structure surrounding the first and second semiconductor chips 120 and 130A to 130D. As shown in FIG. 13, the sealing material 165 may be formed to cover the upper surface 130T of the second semiconductor chip 130A-130D, while being formed to have an upper surface substantially coplanar with the upper surface 120T of the first semiconductor chip 120.

The upper end 161T of the extension portion 161B may be kept low in the regions Sa and Sb between the first and second semiconductor chips 120 and 130A to 130D so that the sealing material 165 may cover the extension portion 161B of the underfill 161.

In a similar way, by lowering the mounting height of the second semiconductor chip adjacent to the first semiconductor chip, deformation due to the underfill raised along the opposite sides may be greatly alleviated.

Figure 14:
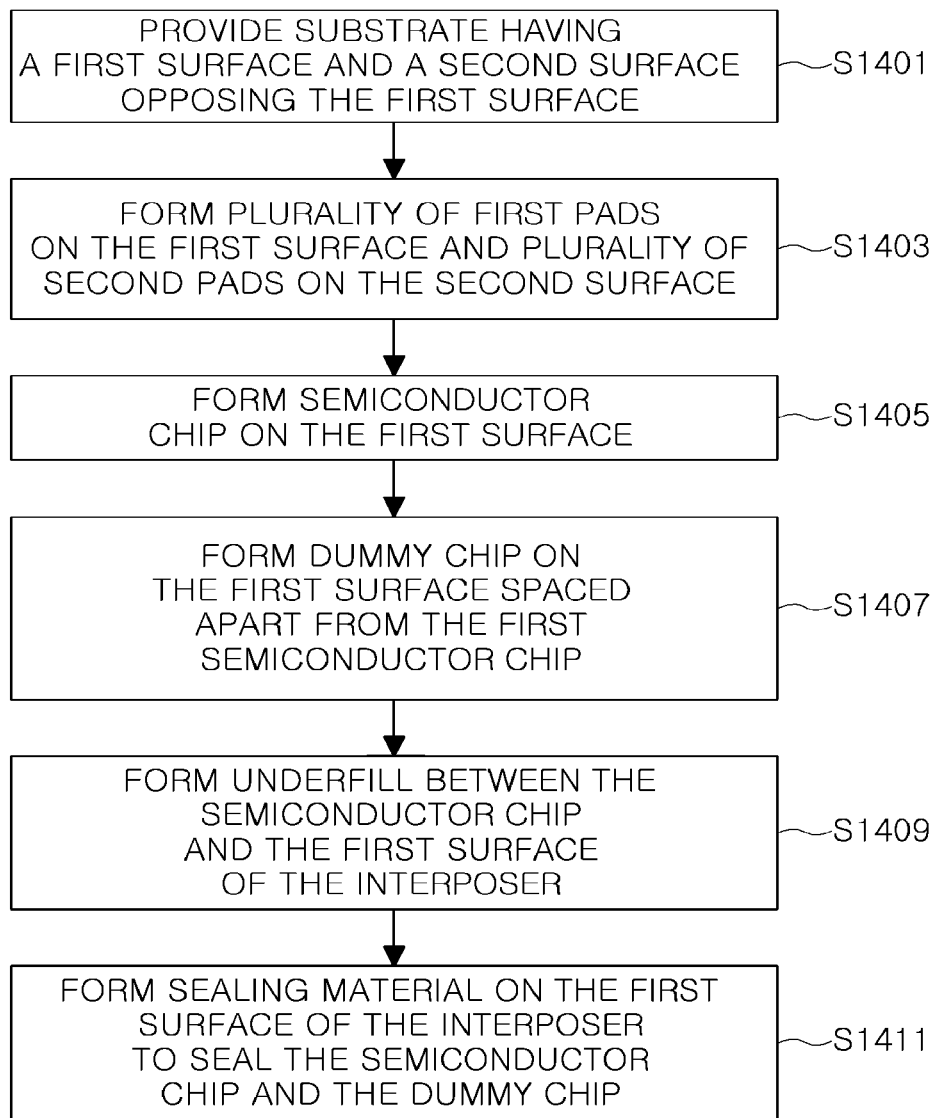
FIG. 14 is a flow chart showing a method of manufacturing a semiconductor device to be used in the semiconductor package according to exemplary embodiments of the present disclosure.

FIG. 14 is a flow chart showing a method of manufacturing a semiconductor device to be used in the semiconductor package 100A according to exemplary embodiments of the present disclosure.

In step S1401, a substrate is provided. The substrate may be the interposer 110 as disclosed above in accordance with the exemplary embodiments. The substrate/interposer 110 may have a first surface 110A and a second surface 110B opposing the first surface.

In step S1403, a plurality of first pads 112 is formed on the first surface 110A of the substrate/interposer 110 and a plurality of second pads 113 is formed on the second surface 110B of the substrate/interposer 110. The plurality of second pads 113 may be electrically connected to the plurality of first pads 112.

In step S1405, a semiconductor chip is attached to the first surface 110A of the substrate/interposer 110 and connected to the plurality of first pads 112. The semiconductor chip may be the semiconductor chip 120 in accordance with the exemplary embodiments disclosed above.

In step S1407, a dummy chip is attached to the first surface 110A of the substrate/interposer 110 spaced apart from the semiconductor chip 120 in a direction parallel to the first surface 110A of the substrate/interposer 110. The dummy chip may be the dummy chip 150 in accordance with the exemplary embodiments disclosed above. The dummy chip 150 having a side surface facing one side surface of the semiconductor chip 120 and having an upper surface 150T positioned lower than an upper surface 120T of the semiconductor chip 120 in a direction perpendicular to the first surface 110A of the substrate/interposer 110.

In step S1409, an underfill is formed between the semiconductor chip 120 and the first surface of the substrate/interposer 110. The underfill may be the underfill 161 in accordance with the exemplary embodiments disclosed above. The underfill 161 having an extension portion 161B extended along the facing side surfaces of the semiconductor chip 120 and the dummy chip 150 in the direction perpendicular to the first surface 110A of the substrate/interposer 110. An upper end 161T of the extension portion 161B being disposed to be lower than the upper surface 120T of the semiconductor chip 120.

In step S1411, a sealing material is formed on the first surface 110A of the substrate/interposer 110. The sealing material may be the sealing material 165 in accordance with the exemplary embodiments disclosed above. The sealing material 165 seals the semiconductor chip 120 and the dummy chip 150.

The semiconductor device manufactured in accordance with the process disclosed above may be used in the exemplary semiconductor packages 100A, 100B, 100C, 200A, and 200B in accordance with the exemplary embodiments disclosed above.

As set forth above, according to an example embodiment, a semiconductor package may significantly alleviate an inflection from warpage, caused by an underfill raised along side surfaces of chips, by way of lowering a mounting height of dummy chip(s) or other semiconductor chip(s) adjacent to a semiconductor chip.

Although the figures described herein may be referred to using language such as "one embodiment," or "certain embodiments," or "example embodiments," these figures, and their corresponding descriptions are not intended to be mutually exclusive from other figures or descriptions, unless the context so indicates. Therefore, certain aspects from certain figures may be the same as certain features in other figures, and/or certain figures may be different representations or different portions of a particular exemplary embodiment.

While example embodiments have been shown and described above, it will be apparent to those skilled in the art that modifications and variations could be made without departing from the scope of the present inventive concept as defined by the appended claims.

What is claimed is:

1. A semiconductor package comprising:
 a substrate having a first surface and a second surface opposing the first surface;
 a plurality of first pads disposed on the first surface of the substrate and a plurality of second pads disposed on the second surface of the substrate and electrically connected to the plurality of first pads;
 a semiconductor chip disposed on the first surface of the substrate and connected to the plurality of first pads;
 a dummy chip having a side surface facing a side surface of the semiconductor chip, disposed on the first surface of the substrate spaced apart from the semiconductor chip, the dummy chip having an upper surface lower than an upper surface of the semiconductor chip,
 wherein the dummy chip overlaps a portion of the plurality of second pads disposed on the second surface of the substrate;
 an underfill disposed between the semiconductor chip and the first surface of the substrate, and having an extension portion extended along the facing side surfaces of the semiconductor chip and the dummy chip in a direction perpendicular to the first surface of the substrate, an upper end of the extension portion contacting the dummy chip at a first level and the semiconductor chip at a second level which is higher than the first level,
 wherein the upper end of the extension portion is disposed to be lower than the upper surface of the semiconductor chip; and
 a sealing material disposed on the first surface of the substrate, and sealing the semiconductor chip and the dummy chip.

2. The semiconductor package according to claim 1, wherein a bottom surface of the dummy chip is lower than a bottom surface of the semiconductor chip.

3. The semiconductor package according to claim 1, wherein an adhesive layer is disposed between a bottom surface of the dummy chip and the first surface of the substrate.

4. The semiconductor package according to claim 1, wherein the sealing material covers the extension portion of the underfill.

5. The semiconductor package according to claim 4, wherein the underfill has a lower modulus than a modulus of the sealing material.

6. The semiconductor package according to claim 4, wherein the underfill has a thermal expansion coefficient higher than a thermal expansion coefficient of the sealing material.

7. The semiconductor package according to claim 1, wherein the first level where the upper end of the extension portion of the underfill contacts the dummy chip is substantially equal to a level of the upper surface of the dummy chip.

8. The semiconductor package according to claim 1, wherein the upper end of the extension portion of the underfill further extends to cover at least a portion of an upper surface of the dummy chip.

9. The semiconductor package according to claim 1, wherein the sealing material covers an upper surface of the dummy chip without contacting the side surface of the dummy chip facing the side surface of the semiconductor chip, and has an upper surface substantially coplanar with the upper surface of the semiconductor chip, and
 wherein the extension portion of the underfill contacts the side surface of the dummy chip.

10. The semiconductor package according to claim 1, wherein a mounting height of the dummy chip is about 60% to about 90% of a mounting height of the semiconductor chip.

11. A semiconductor package comprising:
a substrate having a first surface and a second surface opposite to the first surface;
a plurality of first pads disposed on the first surface of the substrate and a plurality of second pads disposed on the second surface of the substrate and electrically connected to the plurality of first pads;
a logic chip disposed on the first surface of the substrate and connected to a first portion of the plurality of first pads;
a memory chip disposed on the first surface of the substrate spaced apart from the logic chip and connected to a second portion of the plurality of first pads, different from the first portion of the plurality of first pads;
a dummy chip disposed on the first surface of the substrate to at least have a side surface facing one side surface of the logic chip, and having an upper surface with a height different from a height of an upper surface of the logic chip,
wherein the dummy chip overlaps a portion of the plurality of second pads disposed on the second surface of the substrate;
an underfill disposed between the logic and memory chips and the first surface of the substrate, and having an extension portion extended along the facing side surfaces of the logic chip and the dummy chip in a direction perpendicular to the first surface of the substrate, an upper end of the extension portion being disposed to be lower than upper surface of the logic chip; and
a sealing material disposed on the first surface of the substrate, and sealing the logic chip, the memory chip and the dummy chip.

12. The semiconductor package according to claim 11, wherein an adhesive layer is disposed between a bottom surface of the dummy chip and the first surface of the substrate.

13. The semiconductor package according to claim 11, wherein the logic chip and the memory chip have substantially the same mounting height.

14. The semiconductor package according to claim 13, wherein a mounting height of the dummy chip is about 60% to about 90% of a mounting height of the logic chip.

15. The semiconductor package according to claim 13, wherein the sealing material covers the upper surface of the dummy chip, and has an upper surface substantially coplanar with the upper surfaces of the logic chip and an upper surface of the memory chip.

16. The semiconductor package according to claim 15, further comprising a heat sink plate disposed on an upper surface of the semiconductor package.

17. The semiconductor package according to claim 11, wherein the upper end of the extension portion of the underfill contacts the dummy chip at a first level, and the logic chip at a second level which is higher than the first level.

18. The semiconductor package according to claim 11, wherein the extension portion of the underfill between the logic chip and the memory chip is covered by the sealing material.

19. The semiconductor package according to claim 11, wherein the underfill has a lower modulus than a modulus of the sealing material.

20. A semiconductor package comprising:
a substrate having a first surface and a second surface opposing the first surface;
a plurality of first pads disposed on the first surface of the substrate and a plurality of second pads disposed on the second surface of the substrate and electrically connected to the plurality of first pads;
a semiconductor chip disposed on the first surface of the substrate and connected to the plurality of first pads;
a first dummy chips disposed on the first surface of the substrate and adjacent to a first side surface of the semiconductor chip;
a second dummy chip disposed on the first surface of the substrate and adjacent to a second side surface, opposite to the first side surface, of the semiconductor chip, each of the first and second dummy chips having a different heights than the semiconductor chip,
wherein each of the first and second dummy chips overlaps a portion of the plurality of second pads disposed on the second surface of the substrate;
an underfill disposed between the semiconductor chip and the first surface of the substrate, and having an extension portion extended along facing side surfaces of the semiconductor chip and the dummy chip in a direction perpendicular to the first surface of the substrate, an upper end of the extension portion being disposed to be lower than an upper surface of the semiconductor chip; and
a sealing material disposed on the first surface of the substrate,
wherein the sealing material covers the upper surface of the first dummy chip and an upper surface of the second dummy chip, exposing an upper surface of the semiconductor chip.

* * * * *